(12) United States Patent
Yu

(10) Patent No.: US 11,674,987 B1
(45) Date of Patent: Jun. 13, 2023

(54) SWITCH-MODE POWER SUPPLY CONTROL CIRCUIT AND METHOD FOR TAMPERING DETECTION IN A POWER METER

(71) Applicant: RENESAS ELECTRONICS AMERICA INC., Milpitas, CA (US)

(72) Inventor: Zhihong Yu, San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 573 days.

(21) Appl. No.: 16/685,574

(22) Filed: Nov. 15, 2019

Related U.S. Application Data

(60) Provisional application No. 62/777,660, filed on Dec. 10, 2018.

(51) Int. Cl.
*G01R 22/06* (2006.01)
*H02J 9/06* (2006.01)

(52) U.S. Cl.
CPC ............ *G01R 22/066* (2013.01); *H02J 9/061* (2013.01); *H02J 9/068* (2020.01); *H02J 2310/12* (2020.01)

(58) Field of Classification Search
CPC . H02J 2310/12; H01F 38/42; H02M 3/33507; G01R 22/066; G01R 22/068; G01R 11/24; G01R 21/00; G01R 21/133
See application file for complete search history.

(56) References Cited

U.S. PATENT DOCUMENTS

| 8,344,881 B1 * | 1/2013 | Hays | G08B 1/08 340/541 |
| 2004/0189488 A1 * | 9/2004 | Elliott | G01R 21/133 340/870.02 |
| 2012/0130681 A1 * | 5/2012 | Pride | G01R 22/066 324/76.77 |
| 2013/0088353 A1 * | 4/2013 | LaFrance | G01R 11/24 340/551 |
| 2015/0002134 A1 * | 1/2015 | Ramirez | G01R 11/24 324/110 |
| 2017/0373603 A1 * | 12/2017 | Basso | H02H 7/10 |
| 2019/0120885 A1 * | 4/2019 | Kraus | G01R 22/066 |

* cited by examiner

*Primary Examiner* — Rexford N Barnie
*Assistant Examiner* — Rasem Mourad
(74) *Attorney, Agent, or Firm* — Foley & Lardner LLP

(57) ABSTRACT

One or more embodiments relate to a switch-mode power supply control circuit that can be used to provide power to regular single phase or three phase energy meter, while also offering a simple low cost method to detect a magnetic tampering event that usually occurs on energy meter. In one example, the switch-mode power supply for the energy meter is a flyback type switch mode power supply comprising a power switch, a switching controller, and a slew rate based magnetic field detection circuit which is configured to enable a magnetic tampering detection signal that can be communicated to the switching controller. Upon detection of a magnetic tampering event, the power supply and the supporting circuitry can raise the switching frequency of the power switch in order to provide more power to the output or cutoff power to the consumer's power outlet and even report the tampering event to the power station.

22 Claims, 11 Drawing Sheets

SWITCH-MODE POWER SUPPLY CONTROL CIRCUIT AND METHOD FOR TAMPERING DETECTION IN A POWER METER

CROSS-REFERENCE TO RELATED PATENT APPLICATIONS

This application claims priority to U.S. Provisional Application No. 62/777,660, filed Dec. 10, 2018, the contents of which are incorporated herein by reference in their entirety.

TECHNICAL FIELD

The present embodiments relate generally to power management, power electronics, and industrial power products.

BACKGROUND

Power meters can suffer from magnetic tampering events in attempts to steal electricity. Conventional approaches to protect against magnetic tampering include adding a metal shield, adding one or a few Hall magnetic sensors, or one or a few current sensors, all of which incur a high cost. It would be desirable to provide tampering protection with no significant cost increase for the meter manufacturer.

SUMMARY

One or more embodiments relate to a switch-mode power supply control circuit that can be used to provide power to regular single phase or three phase energy meters, while also offering a simple low-cost method to detect magnetic tampering events that occur with such power meters. According to certain aspects, some embodiments can perform a similar function as a Hall sensor, but at minimal cost and without requiring direct sensing the magnetic field, and can also be easily configured to adjust for different settings.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1:
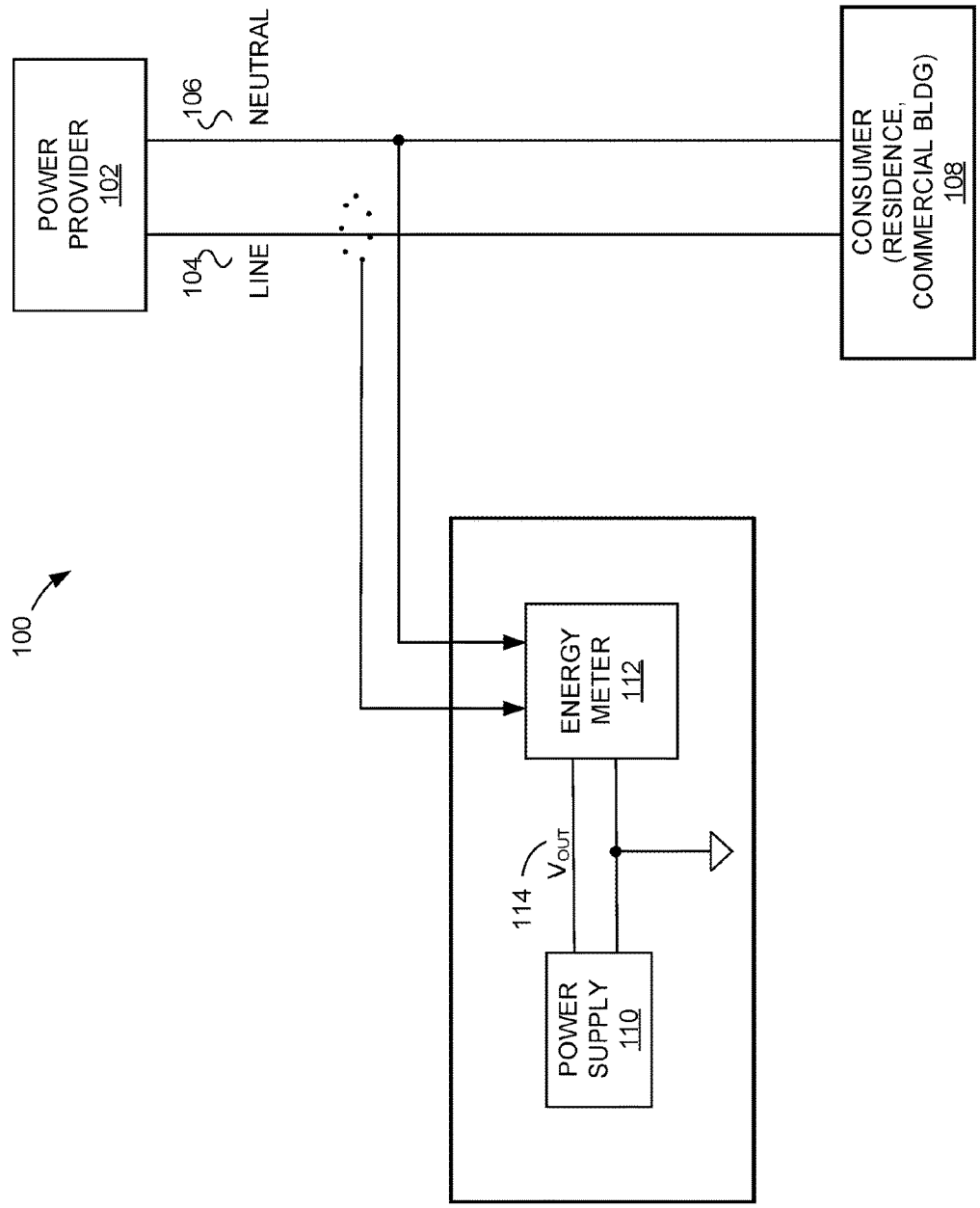
FIG. 1 is a diagram illustrating a standard configuration 100 of an energy meter powered by a conventional power supply.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Embodiments of the present disclosure relate to a method and an apparatus for a power supply for a regular single phase or three phase energy meter, which power supply is also capable of detecting a magnetic tampering event. The disclosed power supply can further report the magnetic tampering event to a power provider to cutoff electricity to a consumer to prevent it from being stolen.

In a typical single phase configuration, a consumer's power mains are coupled to receive a line voltage connection and a neutral connection. An energy meter is configured in a standard way between a power provider and a consumer's power mains to calculate the power used by the consumer.

In one example embodiment, the power supply for the energy meter is a flyback type switch mode power supply comprising a primary switching controller and a slew rate based magnetic field detection circuit which is configured to generate a magnetic tampering detection signal that can be communicated to the switching controller or to any other portion within the energy meter, or communicate to the utility control center. Upon detection of a magnetic tampering event, the power supply and the supporting circuitry can cut off power to the consumer's power mains directly, and perhaps report the tampering event to the power provider to decide the response accordingly.

Without proper detection of such a tampering event, the power provider may fail to receive accurate information about the amount of electricity usage. As mentioned previously, there are a few common methods to deal with magnetic tampering: (1) To add a metal shielding around the meter to block the external magnetic field effect; (2) To use local Hall effect based magnetic sensors to detect undesired changes in magnetic field; (3) To use special magnetic material to make the transformer to make it difficult to saturate. However, all three methods require some additional bill of material or cost to the system.

According to certain aspects, the present embodiments relate to incorporating a magnetic tampering protection function inside an energy meter integrated circuit (IC) which requires no significant cost increase for the meter manufacturers who adopt the IC. This approach has the benefits of lower expenses, a minimized bill of materials, and a simplified energy meter design for detecting a magnetic tampering event by simply adjusting an external resistor value.

As stated earlier, attempts to steal electricity may include magnetic tampering methods such as placing a strong magnet close to a power meter. This strong magnet may saturate the transformer used in the flyback type switch mode power supply so the meter may lose power to measure, calculate, and communicate the electricity fee; or it may demagnetize the main power relay so the remote power provider cannot turn off power when consumer has overdue electricity bill or is tampering the meter in other forms. One conventional method for detecting such tampering events include adding magnetic Hall sensors within the meter to detect undesired changes in the magnetic field inside the meter. Once it senses undesired magnetic field changes, the meter can decide on what actions to make—whether to turn off the entire power to a consumer's home, send a warning or a report to the utility control center, etc. By contrast, a magnetic tampering detection circuit according to the present embodiments can perform a function similar to that of a Hall sensor, but at minimal cost and without a direct sensing the magnetic field. It also is easily configured to adjust for different settings.

FIG. 1 is a diagram illustrating a standard configuration and environment 100 where an energy meter may be used. As shown the configuration includes a power provider 102, a consumer 108, for example a residence or a commercial building, an energy meter 112, and a power supply 110. The consumer 108 is coupled to receive a line voltage LINE 104 and neutral 106 for a single phase connection, and can be up to three line voltage lines and one neutral for three phase connection. The energy meter 112 is coupled to receive a voltage $V_{OUT}$ 114 output by the power supply 110. The power supply 110 and the energy meter 112 are referenced to an electrical ground. The energy meter 112 may be a single phase or a three phase meter which is coupled to calculate the power utilized by the consumer 108. The energy meter may include common circuitry or circuit blocks such as current sense, voltage sense, analog to digital converters, communication section, a display, and more (not shown in FIG. 1) in order to calculate the amount of power utilized by the consumer 108. The power supply 110 may be any conventional power converter such as an ac-dc converter or a dc-dc converter, typically a switch mode power converter. As explained earlier, the power supply 110 is a conventional power supply which is prone to magnetic tampering.

Figure 2:
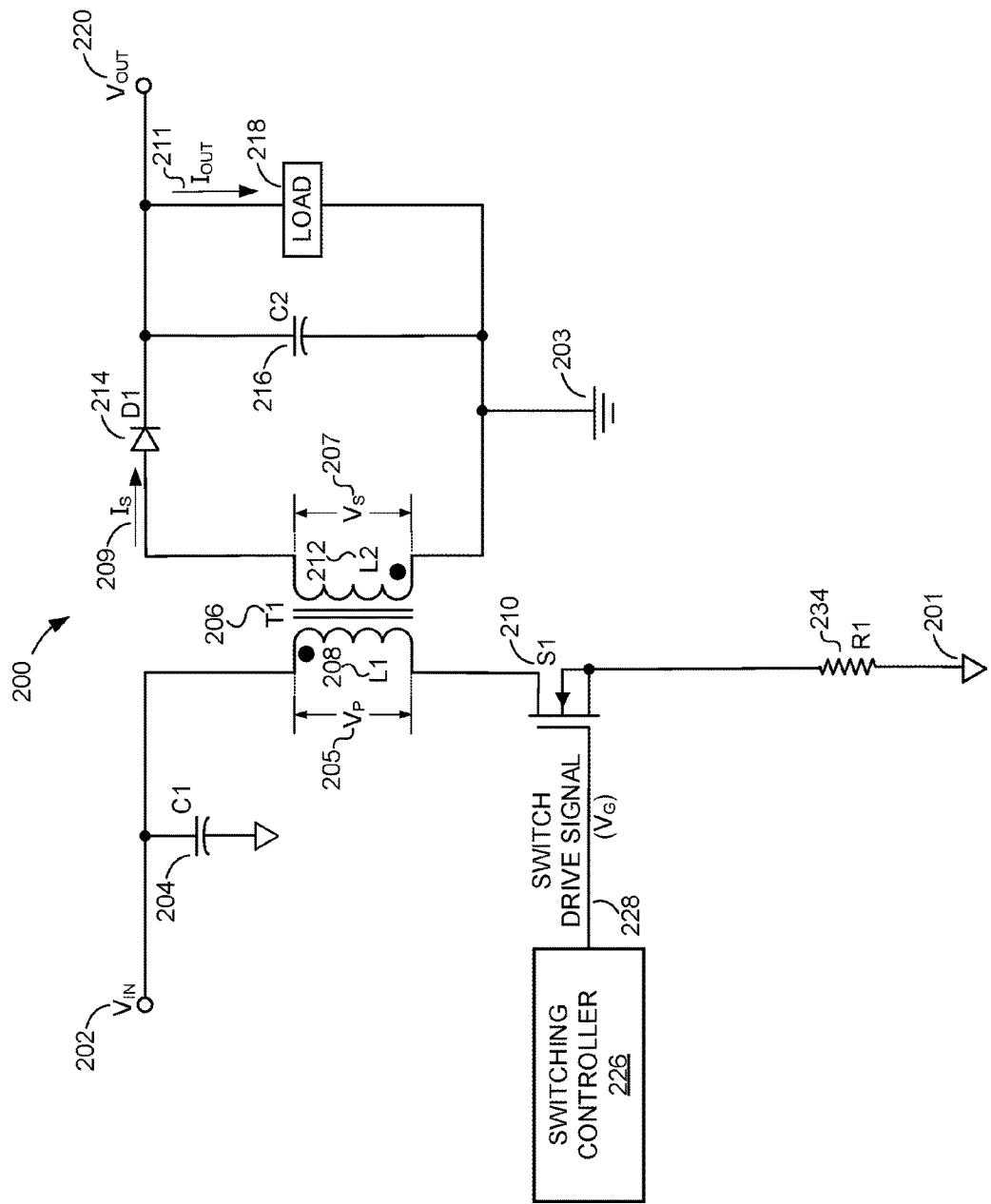
FIG. 2 is a diagram illustrating an example of a conventional flyback type switch mode power supply 200 for the energy meter shown in FIG. 1.

FIG. 2 illustrates an example of a power converter used to provide power to a conventionally available single phase or three phase energy meter or power meter (e.g. meter 112 in FIG. 1). The converter 200 is a flyback type switch mode power supply and is an example of the power supply 110 of FIG. 1. Referring briefly to FIG. 1, in some examples, the power converter 200 can be part of the energy meter 112 and also provide power to various circuit blocks included in therein.

The converter 200 is coupled to receive an input voltage $V_{IN}$ 202 and generate an output voltage $V_{OUT}$ 220 to a load 218 (i.e. power meter 112). The power supply 200 is shown to include an energy transfer element, also referred to as a transformer T1 206, a filter capacitor C1 204, a power switch S1 210, a switching controller 226, a current sense resistor R1 234, a diode D1 214, and an output capacitor C2 216. The transformer T1 206 includes an input side, also referred to as a primary side inductor L1 208, and an output side, also referred to as a secondary side inductor L2 212. The primary side of the supply 200 is referenced to an input return 201 and secondary side of the supply 200 is referenced to ground 203. The input voltage $V_{IN}$ 202 may be a rectified ac voltage or a dc voltage which may be filtered by a capacitor C1 204.

As shown in the depicted example, the primary switch S1 210 opens and closes in response to a switch drive signal ($V_G$) 228 from the switching controller 226. In one example, the primary switch S1 210 may be a metal oxide semiconductor field effect transistor (MOSFET). In another example, primary switch S1 210 may be a bipolar junction transistor (BJT). In yet another example, primary switch S1 210 may be an insulated gate bipolar transistor (IGBT) or other suitable semiconductor switch. In one example, switching controller 226 is implemented as, or within, a single integrated circuit (IC). In another example, both switching controller 226, primary switch S1 210, and current sense resistor 234, can be integrated together within a single integrated circuit (IC). Moreover, in some examples, the current sense resistor 234 may also be integrated with the primary switch S1 210 as a current sense MOSFET.

In general operation, the switching controller 226 generates the switch drive signal 228 to turn the primary switch S1 210 on or off. The primary switch S1 210 is closed when it is turned on and is open when it is turned off. During the time when S1 210 is on, the inductor L1 208 gets charged to store energy and a primary voltage $V_P$ 205 is generated across L1 208. When S1 210 is turned off, the stored energy in the L1 208 is transferred to secondary side through inductor L2 212, which is coupled to L1 208 that form a transformer 206. As a result of this energy transfer, a secondary voltage $V_S$ 207 is generated across L2 212 which is further rectified by D1 214, filtered by C2 216, and appears at the load 218 as the output voltage $V_{OUT}$ 220 and an output current $I_{OUT}$ 211.

Figure 3:
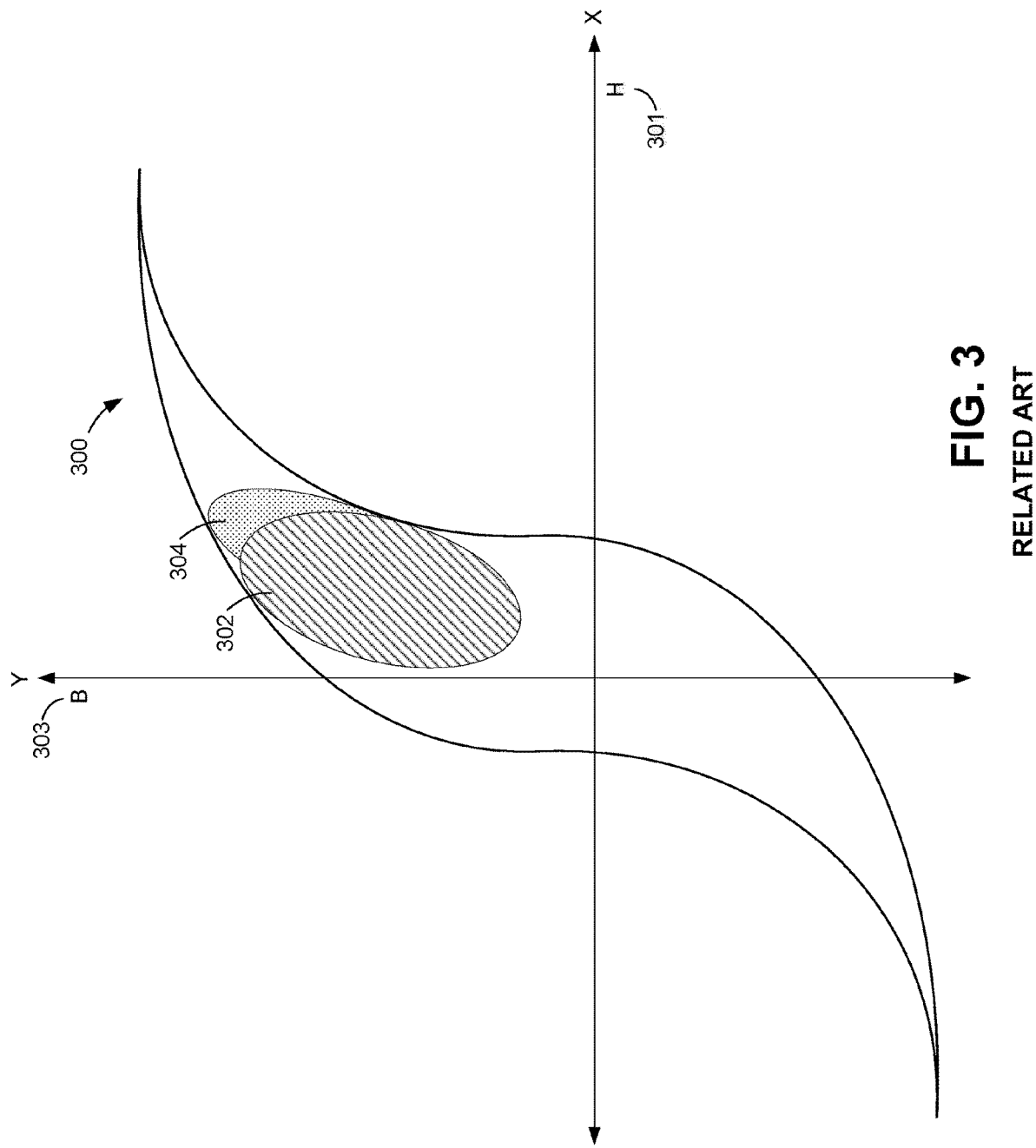
FIG. 3 shows a typical B-H curve 300 (magnetic hysteresis curve) for an inductor included in the flyback converter 200 of FIG. 2.

FIG. 3 shows a typical B-H curve 300 (magnetic hysteresis curve) for the inductor L1 208 in the flyback converter 200 of FIG. 2. As shown, the curve 300 includes shadowed regions 302 and 304. During normal operation, the inductor L1 208 may operate in region 302. As explained earlier, if in a magnetic tampering attempt a strong magnet is placed close to it, then the magnetic flux density B of the inductor L1 208 and the magnetic field strength H both will typically increase and the inductor L1 208 will operate in the region 304. Those skilled in the art will be able to appreciate that, during this process, the coupled inductance of L1 208 will gradually decrease until it is fully saturated. It is possible that, as the inductance gradually decreases, at a certain point it cannot transfer enough power to the output for a given duty cycle and operating frequency of the power switch S1 210. This may eventually cause the output voltage $V_{OUT}$ 220 to the power meter drop. A power meter powered by such an output voltage and used to measure the power output of the flyback converter 200, may thus not be functional in such a scenario, and power can be essentially stolen from the power provider.

Figure 4:
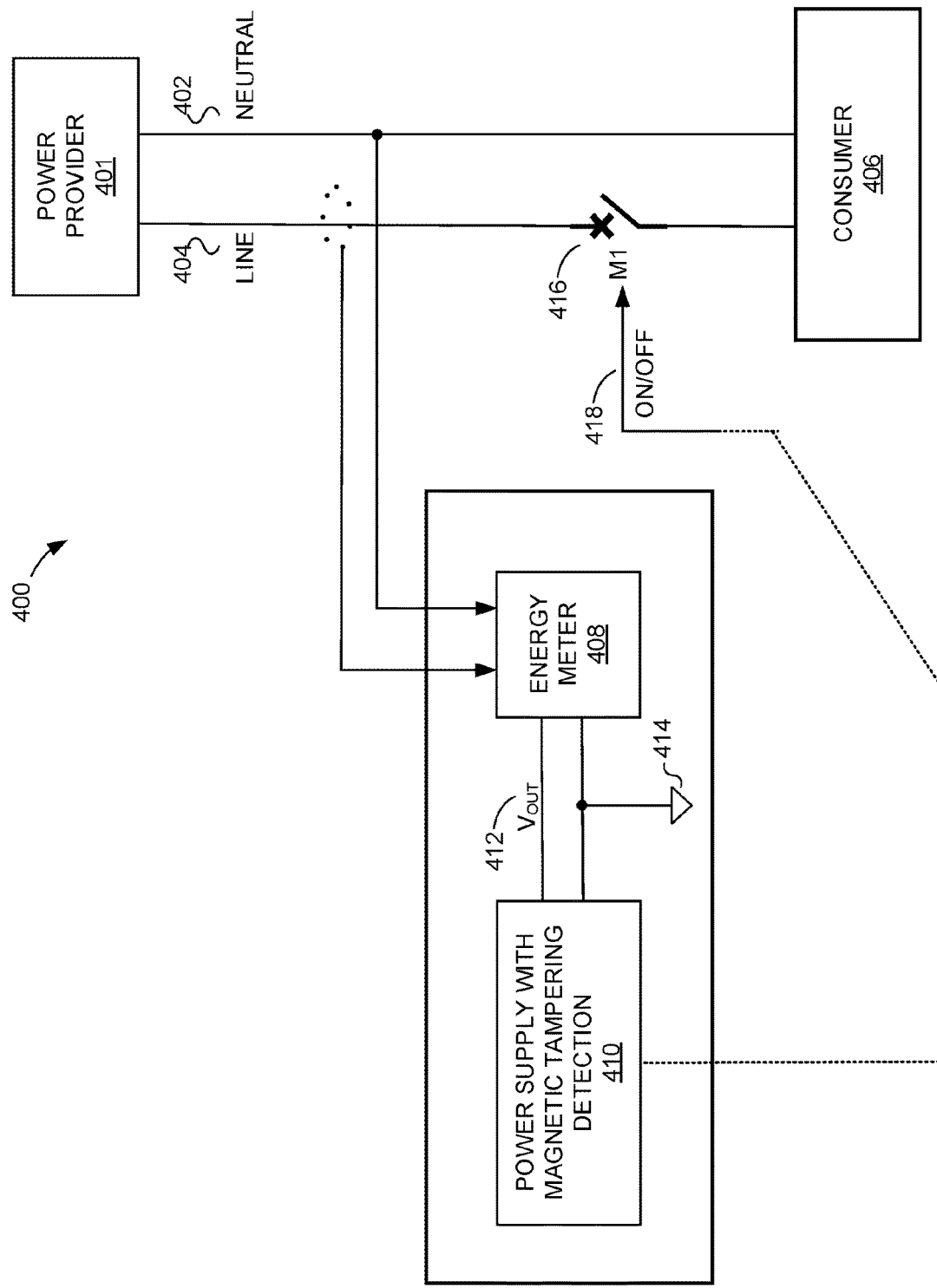
FIG. 4 is a diagram illustrating a configuration 400 of an energy meter powered by a power supply with a magnetic tampering detection circuit, according to an embodiment of the present disclosure.

FIG. 4 is a diagram illustrating a configuration and environment 400 where an energy meter 408 is powered by a power supply with magnetic tampering detection 410, according to an embodiment of the present disclosure. The configuration 400 can be an example improvement of the configuration of FIG. 1 according to embodiments. Additionally from the configuration in FIG. 1, the configuration 400 includes a relay M1 416, via which the consumer circuit 406 is coupled to receive the line voltage 404. One way in which the power supply 410 differs from that of FIG. 1 is that it is capable of cutting off the relay M1 416 via an ON/OFF signal generated by the power supply 410 in the event that magnetic tampering occurs. As will be described in more detail below, additionally or alternatively, the power supply 410 can send a signal to power provider 401, or take other action.

Figure 5:
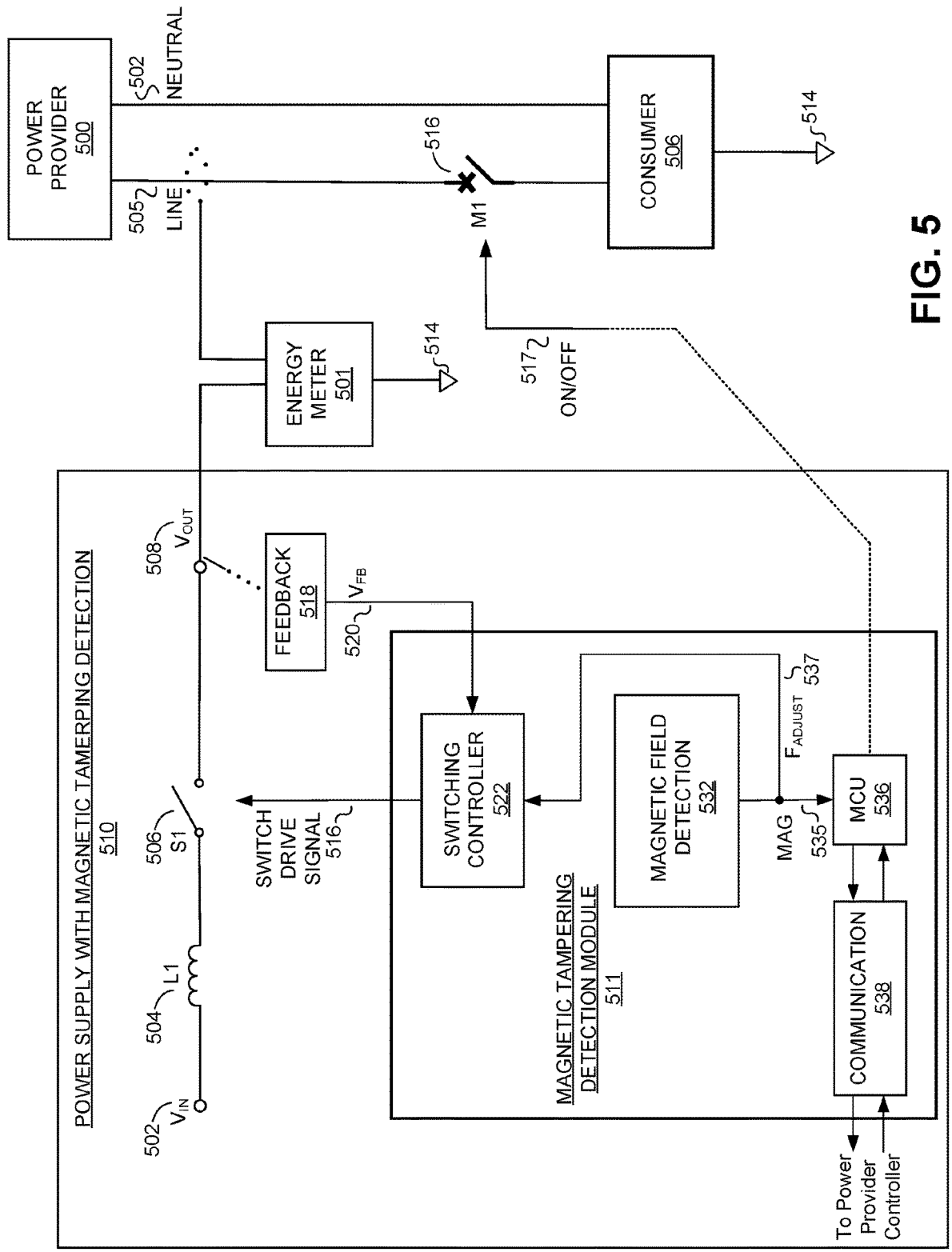
FIG. 5 illustrates an example circuit of a power supply shown in FIG. 4 including a switching controller and a magnetic field detection circuit, according to an embodiment of the present disclosure.

FIG. 5 illustrates further details of an example of a power supply 510, according to an embodiment of the present disclosure. The power supply 510 can be one example of the power supply 410 of FIG. 4 and can include a magnetic tampering detection circuit, according to an embodiment of the present disclosure. The power supply 510 is coupled to receive an input voltage $V_{IN}$ 502 and generate an output voltage $V_{OUT}$ 508 to a load which is in one example can be the circuitry included in the energy meter 501. The supply 510 includes an inductor L1 504, a switch S1 506, a switching controller 522, a magnetic field detection circuit 532, a master control unit (MCU) 536 (which can be microcontroller, DSP, or other digital control IC), and a communication circuit 538. The switching controller 522, the magnetic field detection circuit 532, the MCU 536, and the communication circuit 538 can be considered as part of a magnetic tampering detection module 511. The switching controller 522 is coupled to generate a switch drive signal 516 which controls the turning on and turning off of the switch S1. In some other examples, those may be integrated into a single circuit as part of the switching controller 522. The inductor L1 504 and S1 506 may correspond to the inductor 208 and switch 210 in converter 200

In one example, the magnetic field detection circuit 532 is coupled to output a signal MAG 535, the status or value of which may indicate a magnetic tampering detection event, to the MCU 536. For example, a logic high value of the signal MAG 535 may indicate that magnetic tampering has occurred, whereas a logic low value of the signal MAG 535 may indicate that there is no magnetic tampering occurring. In other words, in case of a magnetic tampering event, the MAG signal 535 may become active or enabled (i.e. maintained or transitioned to a logic high value) and in the absence of a magnetic tampering event, the MAG signal 535 may become inactive or disabled (i.e. maintained or transitioned to a logic low value). In the disclosed embodiment, the MAG signal 535 is a digital signal, but in other examples, it may be an analog signal. If MAG 535 signal is analog, then there may be a preset threshold within MCU536 or communicated through power provider, that when MAG535 exceeds such threshold, MCU536 consider the meter is tampered. As will be explained further below, the MAG signal 535 may be used by MCU 536 to adjust the switching frequency of the switch S1.

For ease of illustration the switching controller 522, MCU 536, communication block 538 and the magnetic field detection circuit 522 have been shown as integrated into a single magnetic tampering detection module 511, however those may be implemented as separate units or circuits. Also in some examples, the magnetic field detection unit 532 can be coupled to provide the signal MAG 535 directly to the switching controller 522 without communication to MCU 536.

As explained earlier with respect to FIG. 4, in one example, in the event that a magnetic tampering event is detected, then the MCU 536 may control ON/OFF signal 517 to cut off the relay M1 516. Referring back to FIG. 4, in some embodiments, the magnetic tampering detection module 511 may also cut off the relay M1 416 in the event of magnetic tampering. Additionally, the MCU 536 may further report the magnetic tampering detection event to the power station or a power station controller via communication block 538 using commonly known wired or wireless protocols such as Wi-Fi, Bluetooth, power line communication, or other methods. This may include bidirectional communications as well. For example, the power station controller (not shown) can repetitively send signals back to MCU 536 to check its status. If there is no returning signal, the power station may now understand that the energy meter is not functioning due to tampering.

In embodiments, where the MAG signal 535 is output to the MCU 536, a frequency adjustment signal $F_{ADJUST}$ 537 may then be generated by the MCU 536 which may be output to the switching controller 522 so as to control the switching frequency of the switch S1 506. In one example, the MAG signal 535 may be coupled to a digital-to-analog converter to generate the $F_{ADJUST}$ 537 signal.

Figure 6:
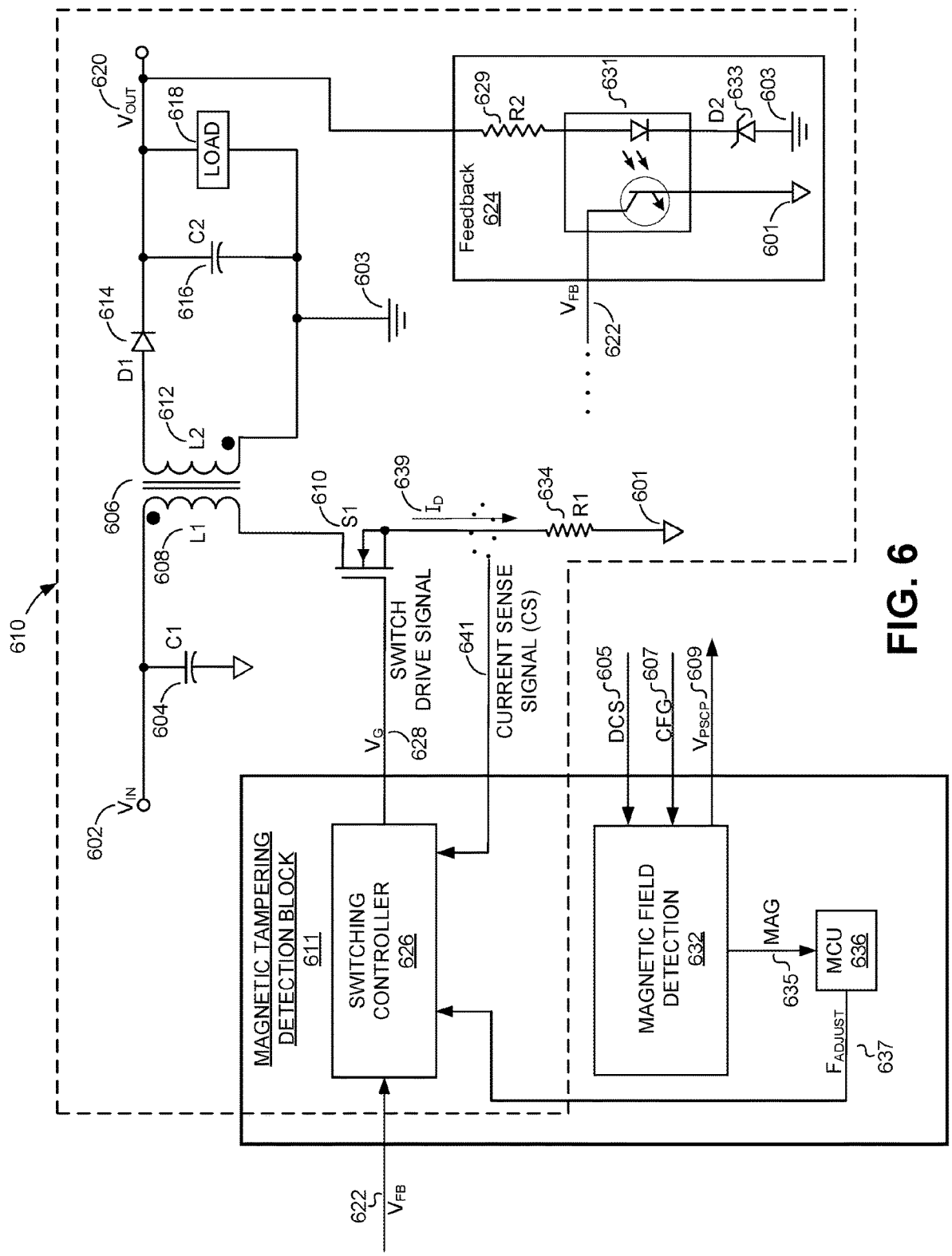
FIG. 6 is a diagram illustrating an example power supply circuit to realize the power supply of FIG. 4, according to an embodiment of the present disclosure.

In one embodiment to be described in more detail below, the magnetic field detection circuit 532 implements a slew rate based magnetic field detection. FIG. 6 illustrates a power supply 610 and a magnetic tampering detection module 611 which can be configured as shown in FIG. 4 and in FIG. 5, according to an embodiment of the present disclosure. The power supply 610 can be similar to the power supply 200 of FIG. 2. The magnetic tampering detection module 611 can be similar to the magnetic tampering detection module 511 as shown in FIG. 5.

The power supply 610 is coupled to receive an input voltage $V_{IN}$ 602 and provide an output voltage $V_{OUT}$ 620 to a load 618 similar to the power supply 200 of FIG. 2. The power supply 610 shares many common circuit elements which are coupled in the same way as explained with respect to FIG. 2, including a transformer T1 606, a capacitor C1 604, a power switch S1 610, a switching controller 626, a current sense resistor R1 634, a diode D1 614, and an output capacitor C2 616.

Additionally, the power supply 610 also includes a feedback circuit 624, an optocoupler 631, and a zener diode D2 633; and generate a feedback voltage signal $V_{FB}$ 622.

Furthermore, the switching controller 626 may also be responsive to a current sense signal 641 which indicates the value of a primary switch current ID 639 in the primary switch S1 610. In one example, the switch drive signal 628 turns the primary switch S1 610 on or off in response to a predetermined value of the current sense signal 641, which is sampled from the current sense resistor R1 634 coupled in series with the switch S1 210. In other examples, any other type current sensing methods such as magnetic Hall sensors may also be used.

Referring back to FIG. 5, the magnetic tampering detection module 611 can be similar to the module 511 as shown in FIG. 5 and can share many common blocks with the module 511 including a switching controller 626, a magnetic field detection circuit 632, an MCU 636, and the related input and output signals.

As stated earlier with respect to FIG. 5, the magnetic field detection circuit 632 can implement a slew rate based magnetic field detection. More particularly, the circuit 632 detects a slew rate of the current sense signal 641, and control the signal MAG 635 or the value of the signal MAG 635 if a magnetic tampering event is detected. The MCU 636 is similar to the MCU 536 and is optional in the system. In embodiments without the MCU 536, the signal MAG 635 can be used to directly change the value of the frequency adjustment signal $F_{ADJUST}$ 637 within the magnetic field detection circuit 632.

Additionally, the magnetic field detection circuit 632 is also coupled to receive a differential current sense signal DCS 605, a configuration signal CFG 607, and coupled to output a predictive short circuit voltage protection signal $V_{PSCP}$ 609, the details of which will be explained in the following paragraphs. In one example, the $V_{PSCP}$ 609 may be further received by the switching controller 626 or the MCU 636 or both. In one example, the signal DCS 605 may be generated from the current sense signal CS 641, the details of which will be later in the specification.

Figure 7:
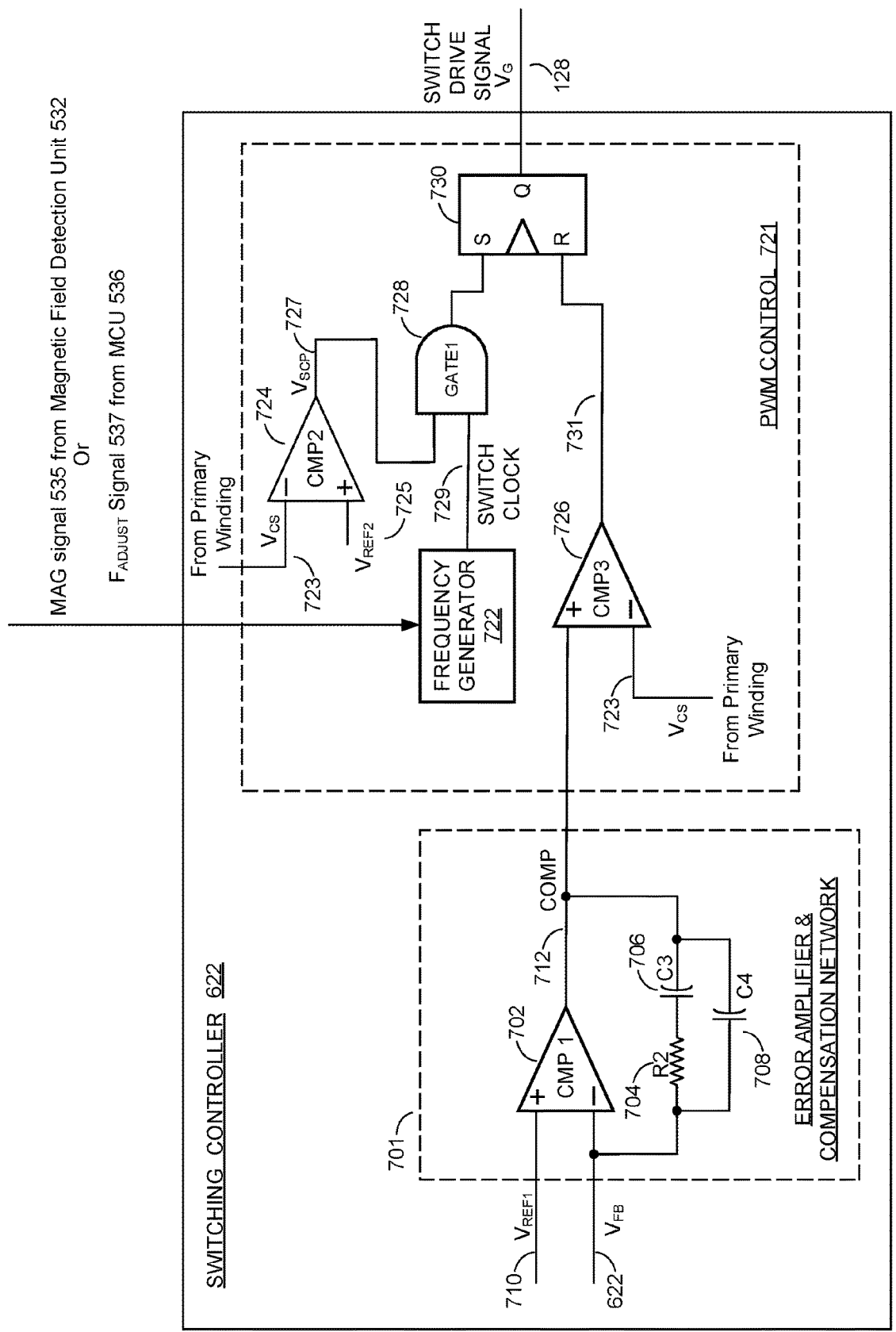
FIG. 7 illustrates the details of the switching controller included in the system of FIG. 6, according to an embodiment of the present disclosure.

FIG. 7 illustrates more detailed aspects of the example switching controller 626 included in the system of FIG. 6, according to an embodiment of the present disclosure. As shown the switching controller includes an error amplifier and compensation network circuit 701 and a PWM control circuit 721. The error amplifier and compensation network circuit 701 further includes a comparator CMP1 702, a resistor R2 704, a capacitor C3 706, and a capacitor C4 708. The comparator CMP1 702 is coupled to receive a reference voltage $V_{REF1}$ 710 at its non-inverting terminal and the feedback voltage $V_{FB}$ 622 at its inverting terminal. As seen, the resistor R2 704, the capacitor C3 706, and the capacitor C4 708 form a compensation network which is coupled between the inverting terminal and the output 712 of the CMP1. The compensation network can be of any type of such as type I, type II, or type III as known to those ordinarily skilled in the art. As may be further appreciated by those with ordinary skill in the art, the feedback voltage $V_{FB}$ 622 is compared with the $V_{REF1}$ 710 signal by the comparator CMP1 702 and the result of the comparison is given by the output signal COMP 712. The value of the voltage signal $V_{REF1}$ may be predefined using an on-chip or off-chip voltage reference using any of the conventional solutions.

The PWM control circuit 721 includes a frequency generator 722, comparators CMP2 724 and CMP3 726, an AND gate 728, and a flip-flop 730. The frequency generator 722 is coupled to receive the MAG signal 535. The comparator CMP2 724 is coupled to receive a voltage signal $V_{CS}$ 723 proportional to the current sense CS signal 120, from the primary winding at its non-inverting terminal and a reference voltage $V_{REF2}$ 725 at its inverting terminal. The output $V_{SCP}$ 727 of the comparator CMP2 724 is further coupled to an input of the AND gate gate1 728. The comparator CMP3 726 is coupled to receive a voltage $V_{CS}$ 723 proportional to the current sense signal 641 from the primary winding L1 608 at its non-inverting terminal and the COMP signal 712 at its inverting terminal.

The frequency generator is coupled to output a switch clock signal 729 to the second input of the AND gate 728. The output of the AND gate 728 is coupled to the set input of the flip-flop 730 and the output of the comparator 731 is coupled to the reset input the flip-flop 730. The output Q of the flip-flop 730 is the switch drive signal 228 as shown in FIG. 2 or 516 as shown in FIG. 5 which controls the switch S1 of FIG. 6.

It may be appreciated that under normal conditions, the frequency generator 722 controls the frequency of the switch clock signal 729 based on the $F_{ADJUST}$ signal 537. In one example, if a magnetic tampering event is detected by the MAG 535, then the MCU may adjust the value of the switch clock 729 in such a way that the frequency and/or the duty cycle of the switch drive signal 128 is increased. The switching controller 626 hence tries to deliver more power to the whole power meter when the tampering event is happening (maximum power is limited by peak temperature usually from main switch 610, or the IC, or the transformer 606). It is possible that when the external magnetic interference is too strong, the meter may still lose power. However, prior to that, upon detecting a decrease in the output voltage $V_{OUT}$ 220, the energy meter is configured to either decide using its own MCU 536 or communicate bi-directionally through 538 to main power provider to decide if it needs to cut off main switch M1 516 to stop the energy supply.

The comparator CMP2 724 may be used for short circuit protection, the value of $V_{REF2}$ 725 may be set to be substantially equal to the short circuit protection voltage $V_{SCP}$ 727. If the $V_{CS}$ 723 is greater than the $V_{REF2}$ 725, then the output $V_{SCP}$ 727 of the comparator will be low which will further disable the AND gate 728. The set input flip-flop 730 will then be zero which will further inhibit the switch drive signal 128 causing it to lower the switching frequency of the switch S1 110 or even stop the switching. CMP2 724 is used to protect the power meter from failure when the load 218 or inductor L2 212 is shorted for any reason.

In one example, the comparator CMP3 726 is operable to compare the voltage $V_{CS}$ 723 proportional to the current sense signal 641 with the COMP signal 712 as in a regular current mode control as known to those ordinarily skilled in the art. If the value of the $V_{CS}$ signal 720 is greater than the COMP signal 712, then the output 731 will be low, further resetting the flip-flop 730. This may further drive the switch drive signal 128 low, turning the switch S1 off, and wait for the next switch clock 729 to set the flip-flop 730 to restart the next switching cycle.

Figure 8:
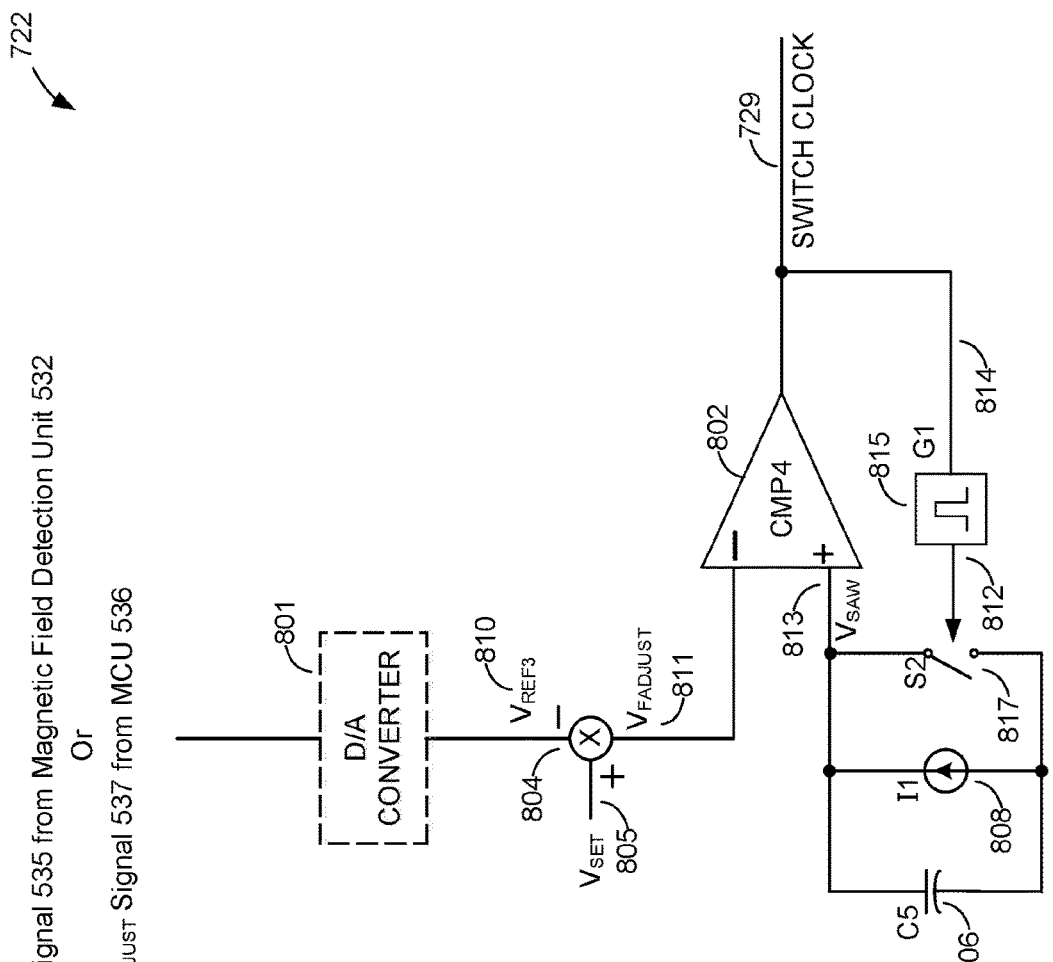
FIG. 8 illustrates an example frequency generator included in the switching controller of FIG. 7, according to an embodiment of the present disclosure.

FIG. 8 illustrates an example implementation of the frequency generator 722 included in the switching controller 522 of FIG. 7, according to an embodiment of the present disclosure. The frequency generator 722 includes a comparator CMP4 802, a subtractor circuit 804, a capacitor C5 806, a current source I1 808, a switch S2 817, and a pulse generator 812. The capacitor C5 806, the current source I1 808, and the switch S2 817, together form a waveform generator, which in one example can be a sawtooth waveform generator.

The subtractor circuit 804 is coupled to receive a voltage signal $V_{REF3}$ 810 derived from the MAG signal 535 or the $F_{ADJUST}$ signal 537; and another reference voltage signal called as $V_{SET}$ 805.

In one example, the frequency generator 722 may include another internal voltage reference having the default preset value $V_{SET}$ 805. The same internal voltage reference used to generate a voltage shown as $V_{REF3}$ 810, whose voltage can be adjusted by the MCU 536 using a D/A converter 801. In one example, the MCU 536 can adjust the value of $V_{REF3}$ 810 in response to the value or status of the signal MAG 535. For example, the MCU 536 can make the $V_{REF3}$ 810 equal to a first voltage, also referred to as magnetic tampering active voltage or MAG active voltage, if the MAG signal is enabled or active.

Similarly, the MCU 536 can make the $V_{REF3}$ 810 equal to a second voltage, also referred to as a magnetic tampering inactive voltage or MAG inactive voltage, if the MAG signal is disabled or inactive. The MCU 536 further uses the adjusted value of the $V_{REF3}$ 810 to adjust the switching frequency of the switch S1 110. In one example, the magnetic tampering active voltage is greater than the magnetic tampering inactive voltage. Under In one example, the $V_{REF3}$ 810 is subtracted from the $V_{SET}$ 805 and a resulting voltage signal $V_{FADJUST}$ 811, also referred to as frequency adjust voltage, is coupled to the inverting terminal of the CMP4 802. The pulse generator G1 815 is coupled between the output of the CMP4 802 and a control terminal of S2 817.

At the non-inverting terminal, the C5 806, I1 808, and the switch S2 817 are all coupled in parallel to operate the switch S2 at a predefined switching frequency under initial and normal operating conditions. Also under initial or normal operating conditions, the output voltage of the 811 may be such that the switch clock signal 729 is high.

As can be seen, the result of the subtraction of $V_{REF3}$ 810 and $V_{SET}$ 805, is the $V_{FADJUST}$ 811 voltage. It may be appreciated that the $V_{FADJUST}$ 811 will be lower when the MAG 535 signal is active than when it is inactive. The lower value of $V_{FADJUST}$ 811 may be referred to as $V_{FADJUST\_LOW}$ and the higher value of $V_{FADJUST}$ 811 may be referred to as $V_{FADJUST\_HIGH}$.

The capacitor C5 806, the current source I1 808, and the switch S2 817 form a sawtooth waveform generator. Initially, it may be assumed that the output of the comparator CMP4 802 is low and S2 817 is open. At this time, the I1 808 charges C5 806 until $V_{SAW}$ 813 becomes equal to the value of $V_{FADJUST}$ 811 after which output switch clock 729 becomes high and turns on the single pulse generator G1 811 which further turns on or closes S2 817. After the switch S2 817 is closed the C5 806 discharges after or within a given time T. This process may continue for any give value of $V_{FADJUST}$ 811. As the C5 806 starts to discharge the $V_{SAW}$ 713 starts to gradually decrease. When it becomes slightly or substantially lower than the $V_{FADJUST}$ 811, the output switch 729 becomes low turning off the pulse generator G1 815 which opens the switch S2 817 and the C5 806 starts to charge again. In one example, the switch S2 817 will open after the C6 has completely discharged. There may be additional circuitry included to introduce extra delay for the opening or closing of the switch S2 817. The switch S2 817 may open after the C5 806 is discharged to a level that is equal to the $V_{FADJUST}$ 811. This process causes the switch clock 729 to toggle at a particular frequency that can be adjusted by $V_{FADJUST}$ 811.

Referring back to FIG. 7, as such the switch clock 729 may define a particular switching frequency of the switch drive signal 228 as shown in FIG. 2 or 516 as shown in FIG. 5.

When a magnetic tampering event is detected, a high MAG 535 signal as explained earlier is received by the frequency generator 722; the $V_{REF3}$ 810 is made equal to the corresponding active magnetic detection voltage, which in this case is greater than the inactive magnetic detection voltage. This decreases the value of $V_{FADJUST}$ 811, causing the $V_{SAW}$ 813 to reach the $V_{FADJUST}$ 811 faster than before. This in turn causes the output switch clock 729 to toggle faster, which increases the frequency of the switch drive signal 228. In another example, if the MCU 536 decides to increase the switching frequency of the switch drive signal 228 to push for more power in a magnetic tampering event and if the inductor L1 208 is approaching saturation, then it can increase the value of $V_{REF3}$ 810 or vice versa. As such the frequency of the switch clock 729 signal is increased to push for more power.

Referring back to FIG. 7, one of the inputs (switch clock) to AND gate 728 is high. Considering that the short circuit protection voltage $V_{SCP}$ 727 is not exceeded, the AND gate 728 will be enabled. In this scenario, the switch drive signal 228 as shown in FIG. 2 or 516 in FIG. 5 will keep controlling the switch normally in response to the feedback voltage $V_{FB}$ 622.

In the event that magnetic tampering occurs, the MAG signal 535 or the $F_{ADJUST}$ signal 537 may change state or the voltage proportional to those that may change. As a result of this, the output 811 of the subtractor circuit 804 will change and may become greater than the voltage at the non-inverting terminal 813. In such a scenario the value of the switch clock 729 will change and may become zero in one example. Referring back to FIG. 7, a zero value of the switch clock 729 will disable the AND gate 728, further disabling the flip-flop 730 and inhibiting or modifying the switch drive signal 729 at least momentarily or for a longer duration. If the switch drive signal 729 is disabled or the value of it is changed in this way, then further action of reporting the tampering event to the power station may be performed. As such, the frequency generator 722 will modify or inhibit the switch drive signal based on the change in the status or the value of the MAG signal 535. As will be explained further, the change in the status or the value of the MAG signal 535 is responsive to a slew rate based magnetic field detection.

Figure 9:
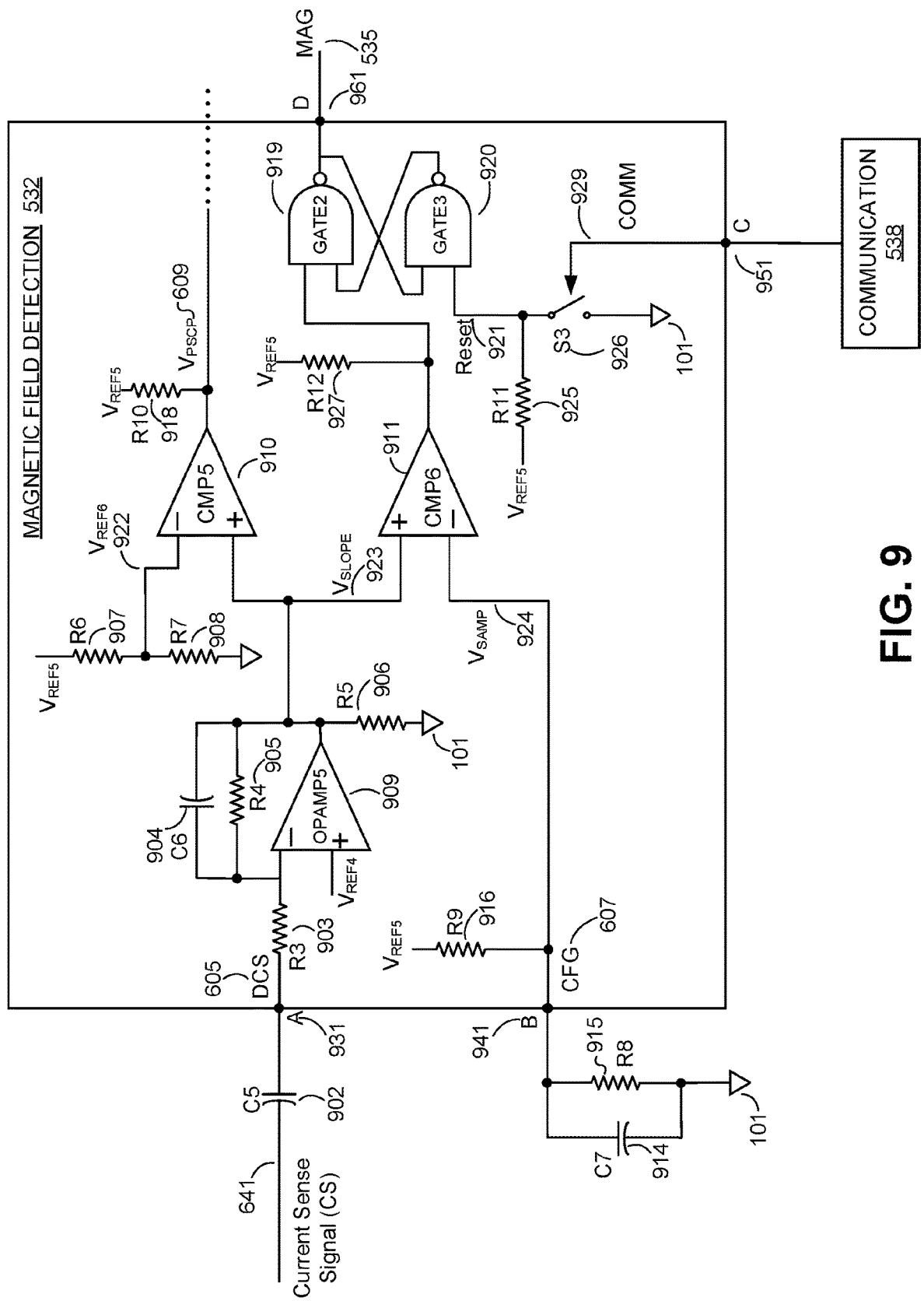
FIG. 9 illustrates the details of an example magnetic field detection circuit as an integrated circuit, according to an embodiment of the present disclosure.

FIG. 9 illustrates an example implementation of the magnetic field detection circuit 532 of FIG. 5 according to an embodiment of the present disclosure. The circuit 532 is shown as one block in an integrated circuit in this example, however, it may also be implemented in discrete blocks.

As shown, the magnetic field detection circuit 532 includes an operational amplifier (op-amp) opamp5 909, comparators CMP5 910 and CMP6 911, and gates GATE2 919 and GATE3 920. The circuit further includes capacitors C5 902, C6 904, C7 914; resistors R3 903, R4 905, R5 906, R6 907, R7 908, R8 915, R9 916, R10 918, R11 925, R12 927; and a switch S3 926. The switch S3 926 can be a semiconductor switch of any form.

The magnetic field detection circuit 532 is coupled to receive the signal DCS 605 at a terminal A 931, the configuration signal CFG 607 at a terminal B 941, an optional signal COMM 929 from the communication circuit 538 at a terminal C 951; and coupled to output the signal MAG 535 at a terminal D 961.

Referring back to FIG. 6, in one example, the current sense signal 641 is coupled via the capacitor C5 902 to generate the signal DCS 605 which is further received by the integrated circuit 532 at the terminal A 931. In another example, C5 902 can be integrated into the IC.

In other examples, in the integrated configuration, the DCS 605, CFG 607, and MAG 535 can be pins or terminals of the IC. MAG 535 is also coupled other internal blocks such as the frequency generator 722 as shown in FIG. 7 and the D/A converter 801. In some examples, the MAG 535 can also be an individual pin or a terminal on the frequency generator 722 and the D/A converter 801.

A differential op-amp circuit is comprised of C5 902, opamp5 909, R3 903, C6 904, R3 903, and R4 905. This circuit is used to detect the rising slope of current sense signal 641. During circuit operation, at the output terminal of $V_{SLOPE}$ 923, the voltage may be equal to Vref4− R2*C1*dV/dt, where the dV/dt corresponds to the change slope of current sense signal 641.

In a first comparison, the comparator CMP6 911 compares the voltage $V_{SLOPE}$ 923 to a voltage $V_{SAMP}$ 924. If $V_{SLOPE}$ 923 is less than $V_{SAMP}$ 924, the output of CMP6 911 becomes low, setting the output of NAND gate2 919 high; which is equivalent to setting the signal MAG535 high, indicating to the rest of circuit that magnetic tampering is happening. $V_{SAMP}$ 924 here can be referred to as a tampering threshold voltage.

The $V_{SAMP}$ 924 is adjusted by a resistor divider formed by R9 916 and R8 915, filtered by C7 914. The purpose of the resistor divider and the filter is to accommodate line and neutral voltages in various countries. For example, in the US the line voltage 104 is 110 VAC, whereas in China it is 220 VAC. Hence the meter circuit designer must be able to adjust the $V_{SAMP}$ 924. In one example, R8 915 is outside of the IC. In other examples, R8 915 can be integrated into the IC, in yet another example, the $V_{SAMP}$ 924 can be configured via the communication circuit 538 from the power provider, or by other voltage configuration methods.

In a second comparison, the comparator CMP5 910 compares the voltage $V_{SLOPE}$ 923 to another reference Vref6 924, which is lower than $V_{SAMP}$ 924. If $V_{SLOPE}$ 923 is lower than $V_{REF6}$ 922, then the $V_{PSCP}$ 609 output becomes low, indicating a more serious fault such as an output short circuit, or it may also indicate that the transformer is completely demagnetized from severe tampering, and the circuit must quit all operation and restart or completely shut down. As explained with respect to FIG. 6, the $V_{PSCP}$ 609 signal may be received by one or both the switching controller 626 or the MCU 636.

In one example, predictive short circuit protection voltage $V_{PSCP}$ 609 and the short circuit protection voltage $V_{SCP}$ 727 are configured to provide the same type of short circuit protection. However, the $V_{PSCP}$ 609 is provides more of a predictive short circuit protection as it is a result of comparison of the $V_{SLOPE}$ 923 and the $V_{REF6}$ 922. The $V_{PSCP}$ 609 is coupled to detect an irregular high rising slope in the current sense signal CS 641. In other words $V_{PSCP}$ 609 signal is coupled to indicate an irregular increase in the power switch current ID 639 and may decide to turn off the meter before any catastrophic issue such as before the switch current ID 639 rises to a predefined higher peak value or a maximum value.

The $V_{SCP}$ 727 is a result of the comparison of $V_{REF2}$ 725 and the voltage $V_{CS}$ 723 proportional to the current sense signal 641 as shown in FIG. 7, and as such provides a protection after a short circuit event has occurred to avoid further damage to the power switch S1 210.

The NAND gate2 919 and NAND Gate3 920 form a SR latch circuit, here the MAG output 535 will be latched at high state unless RESET 921 signal is pull high to clear the latch state. In one example, $V_{REF5}$ with R11 925 is connected to Reset 921 and always set it high, so the meter may record one tampering event but does not do anything. In another example, S3 926 is always connected to ground so RESET 921 never releases, MAG 535 is always high, and is configured to report the tampering situation to the power provider constantly the even after tampering event has passed, until the RESET 921 is cleared by the power provider 102 turning off S3 926 through the remote communication circuit 538.

Figure 10:
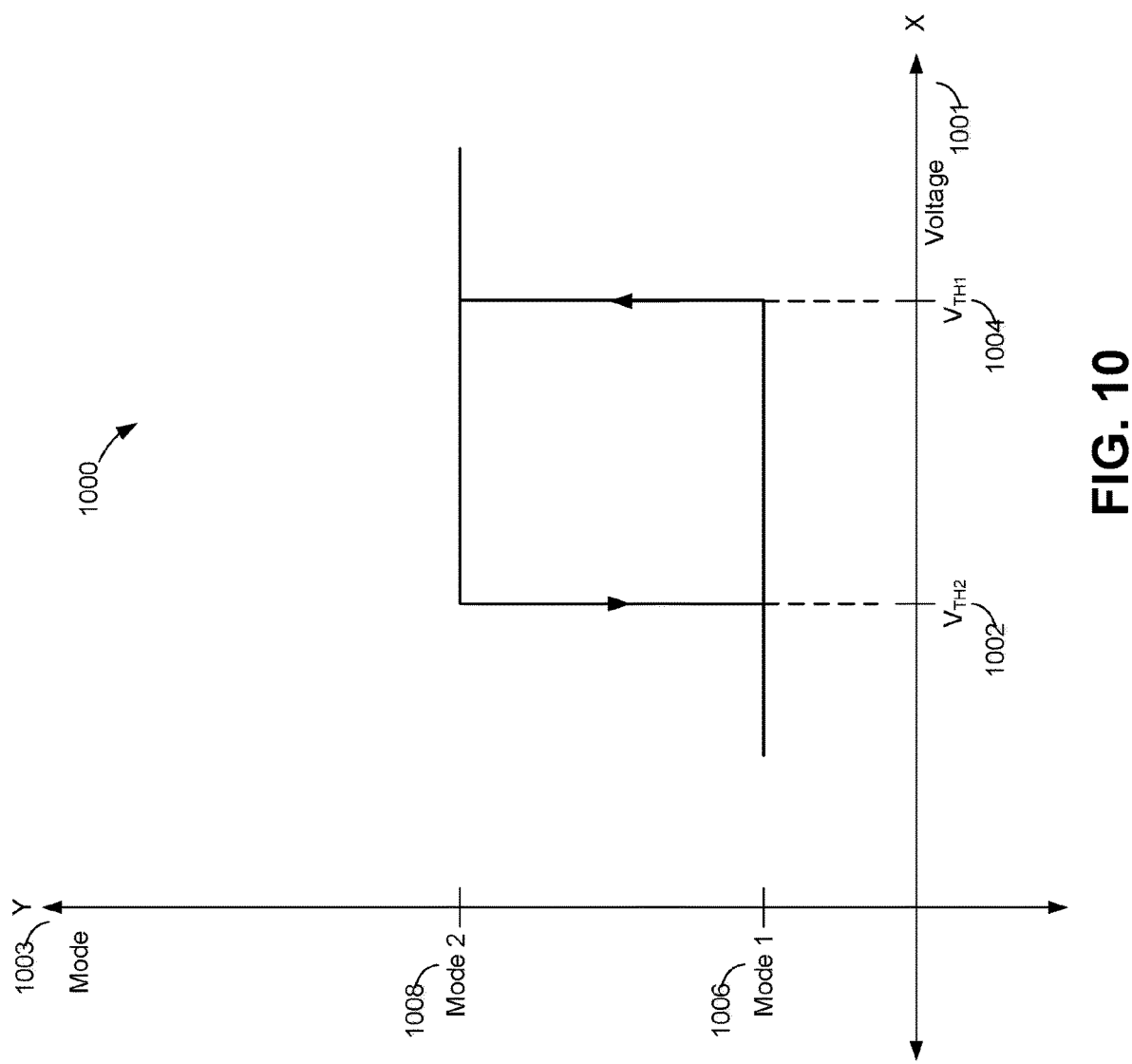
FIG. 10 illustrates various modes of operations of the power supply of FIG. 4 or FIG. 5 in the presence and absence of a magnetic tampering event.

FIG. 10 illustrates a graph 1000 of various modes of operations of the power supply of FIG. 4 or FIG. 5 or FIG. 6 in the presence and absence of a magnetic tampering event.

Shown on an X axis 1001 is the voltage $V_{CS}$ 921 and shown on a Y axis 1003 are modes of operation mode1 1006 and mode2 1008. Initially it may be assumed that there is no magnetic tampering event detected and the power supply 510 is operating normally in mode 1 1006. Referring back to FIG. 9, at this time, the $V_{SLOPE}$ 923 is higher than the $V_{SAMP}$ 924.

In one example, if there is a magnetic tampering event, then the $V_{SLOPE}$ 923 starts to decrease and when it becomes substantially equal to the $V_{SAMP}$ 924, then the power supply 510 may enter mode 2 1008, indicating that a magnetic tampering event is detected.

Figure 11:
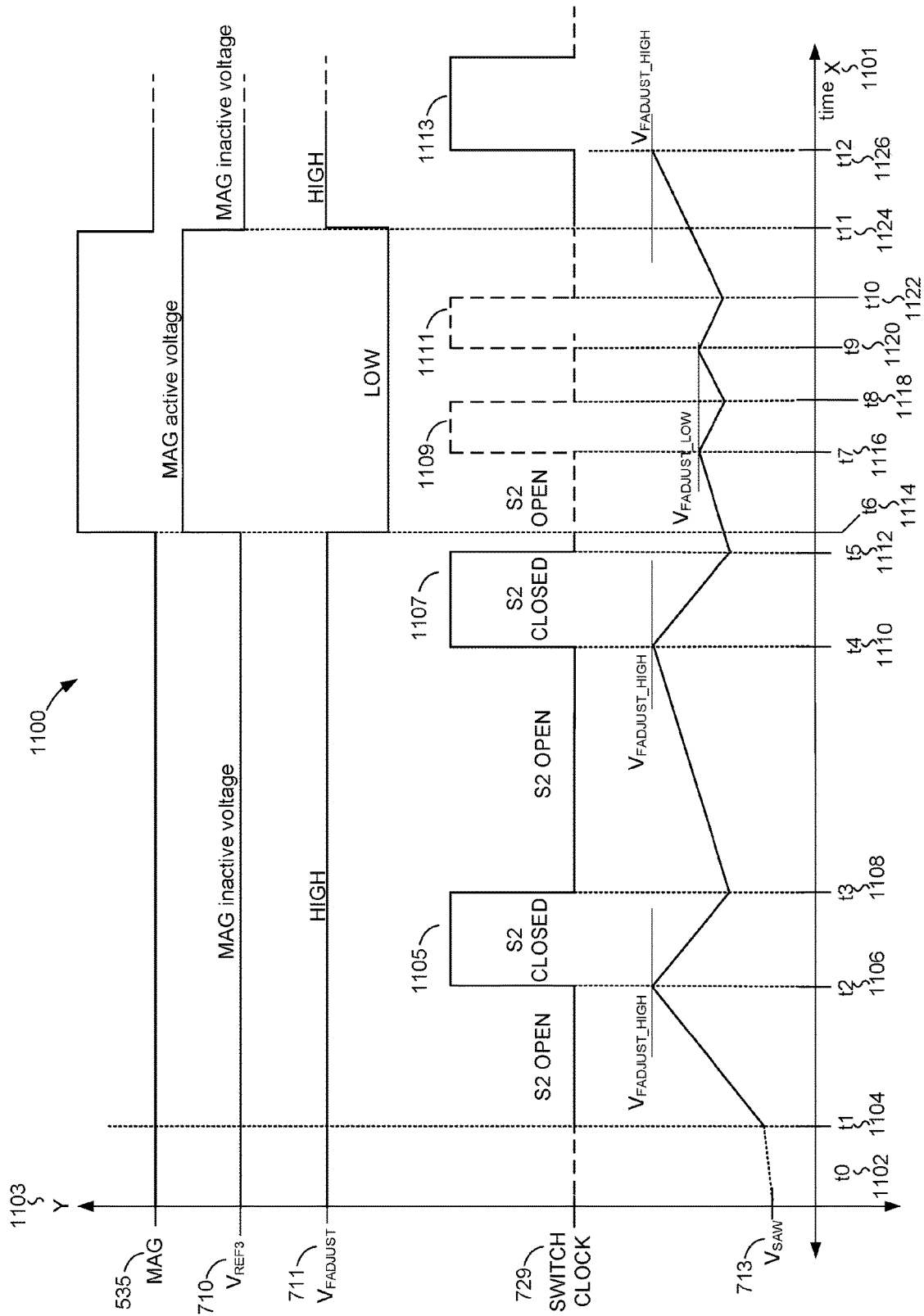
FIG. 11 illustrates a timing diagram of various signals shown in FIG. 8, according to an embodiment of the present disclosure.

FIG. 11 illustrates a timing diagram 1100 of the various signals shown in FIG. 8, according to an embodiment of the present disclosure. Shown on the X axis 1101 is time and on Y axis 1103 are signals MAG 535, $V_{REF3}$ 810, $V_{FADJUST}$ 811, switch clock 729, and $V_{SAW}$ 813.

The timing diagram 1100 illustrates an example behavior of the above-mentioned signals of the frequency generator circuit 722, in the presence and absence of a magnetic tampering event, and assists in understanding an example methodology according to the embodiments. Specifically, diagram from time t0 1102 to t6 1114, and from time t11 and t12 including the switch clock pulses 1105, 1107, and 1113 illustrate an example behavior of the frequency generator circuit 722 in the absence of a magnetic tampering event.

The diagram from time t6 1114 to time t11 1124 including the switch clock pulses 1109 and 1111 illustrate an example behavior of the frequency generator circuit 722 in the presence of a magnetic tampering event.

At time t0 1102, it may be assumed that the MAG signal 535 is low indicating that there is no magnetic tampering detected and the power supply is operating under normal conditions. The switch S2 817 is open. As explained earlier with respect to FIG. 8, the $V_{REF3}$ 710 has the value of MAG inactive voltage and the $V_{FADJUST}$ 811 has at a high value.

At time t1 1104, the current source I1 808 starts to charge the capacitor C5 806 and the $V_{SAW}$ 713 begins to increase gradually.

At time t2 1106, it may be assumed that the $V_{SAW}$ 713 becomes equal to $V_{FADJUST}$ 811. At this time the output switch clock 729 of the comparator CMP4 802 becomes high. This turns on the pulse generator G1 811 closing the S2 817. The C5 806 begins to discharge at this time and the $V_{SAW}$ 713 gradually begins to decrease.

At time t3 1108, the $V_{SAW}$ 713 becomes lower than $V_{FADJUST}$ 811 and the switch clock 729 becomes low and the switch S2 817 becomes open. The C5 806 starts to charge again. In one example, the switch S2 817 may be a MOSFET. It may be appreciated that the switch S2 817 may be opened or closed by a common circuit design such as controlling the gate of the MOSFET. When the switch clock 729 is high, it turns on the gate 812 of S2 817 and turns the S2 817 on; and when the switch clock 729 is low, it turns off the gate 812 of S2 817 and turns the S2 817 off. In other examples, there may be other circuit arrangements or logic to turn on or off the switch S2 817. The pulse generator G1 may use a fixed frequency to make sure that the switch S2 817 is turned on and off once in a single pulse.

In some examples, C5 806 may continue to discharge for some time after t3 1108 or until it is fully discharged before it starts charging again.

From the time t4 1110 until time t5 1112, the above process may repeat, and the switch clock 729 may toggle at a predetermined frequency in the absence of any magnetic tampering event MAG 535 signal.

At time t6 1114, a magnetic tampering event is detected and the MAG 535 signal become high. At this time the $V_{REF3}$ 710 is made equal to the MAG active voltage by the MCU 536 and $V_{FADJUST}$ 811 becomes low, as explained with respect to FIG. 8.

At time t7 1116, the $V_{SAW}$ 713 becomes equal to $V_{FADJUST}$ 811 and the switch clock 729 becomes high, closing the switch S2 817 via the pulse generator G1 811. It may be appreciated that since the $V_{FADJUST}$ 811 now has a lower value, the $V_{SAW}$ 713 reaches the value $V_{FADJUST}$ 811 in a shorter time than compared to when the MAG 535 signal was inactive. The C5 806 begins to discharge and the $V_{SAW}$ 713 begins to decrease.

At time t8 1118, the switch clock 729 becomes low again, opening the switch S2 817 via the pulse generator G1 811. The capacitor C6 starts to charge again. As the MAG 535 signal is still high, the value of $V_{REF3}$ is still equal to the MAG active voltage and the value $V_{FADJUST}$ 811 is still low. The above process from t6 1114 to t8 1118 repeats from t8 1118 through t9 1120 until t10 1122.

After t10 1122, the C5 806 starts to charge again and VSAW 713 starts to increase. However, as it is increasing, at time t11 1124, the MAG 535 signal goes low indicating that there is no magnetic tampering. The $V_{REF3}$ becomes equal to the MAG inactive voltage which is higher than the MAG active voltage and $V_{FADJUST}$ 811 has a higher value. The capacitor C5 806 charges for a longer time now in order to make the $V_{SAW}$ 713 equal to $V_{FADJUST}$ 811.

At time t12 1126, the $V_{SAW}$ 713 becomes equal to $V_{FADJUST}$ 811 and the switch clock 729 becomes high and the process repeats as explained before at a predetermined frequency in the absence of a magnetic tampering event.

In the above specification, the terms "power converter" and "power supply" may be used interchangeably to mean the same thing. The terms "coupled to", "configured to", "operable to" may be used interchangeably to mean the same thing.

In the above specification, some common electronic circuits such as flip-flops or other digital circuits may be clocked by on-chip oscillators derived from phase locked loops (plls), crystal oscillators or any other conventional methods of generating a clock. In other embodiments, the clocks could be external as well.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A switch-mode power supply for an energy meter coupled between a power station and a consumer comprising:
    a primary winding of a primary side of a transformer, the primary winding coupled with an input voltage;
    a secondary winding of a secondary side of an inductor, the secondary winding coupled to provide an output voltage, an output current, and an output power to the energy meter;
    a magnetic field detection circuit including a comparator and a Set-Reset (SR) latch circuit, the comparator having a first input receiving a slope voltage indicating a slope of a current sense signal based on the input voltage and having a second input receiving a tampering threshold voltage;
    the magnetic field detection circuit operable to detect a magnetic tampering event in response to detection by the comparator that the slope voltage is less than the tampering threshold voltage; and
    the magnetic field detection circuit operable to generate, by the SR latch circuit in response to the detection by the comparator that the slope voltage is less than the tampering threshold voltage, a signal having a logic value indicating the magnetic tampering event.

2. The power supply of claim 1, wherein the magnetic field detection circuit is coupled to generate a magnetic tampering detection signal upon detection of the magnetic tampering event.

3. The power supply of claim 2, wherein the magnetic field detection circuit is coupled to generate the magnetic tampering detection signal in response to sensing a primary winding current or a primary winding voltage.

4. The power supply of claim 2, further comprising:
    a power switch coupled with the primary winding on the primary side; and
    a switching controller having a frequency generator circuit to sense the magnetic tampering detection signal and adjust a duty cycle of power switch coupled with the primary winding.

5. The power supply of claim 1, further comprising a master control circuit and a communication circuit, wherein the master control circuit is operable to communicate with the communication circuit which is configured to send a notification to a power station controller upon detection of the magnetic tampering event.

6. The power supply of claim 3, wherein the magnetic field detection circuit is coupled to generate the magnetic tampering detection signal after a time delay proportional to an overall slew rate of the primary winding current.

7. The power supply of claim 1, further comprising:
    The SR latch circuit having a plurality of logic gates, the SR latch circuit having an input coupled with an output of the comparator, and having an output to indicate the magnetic tampering condition.

8. The power supply of claim 7, one or more of the plurality of logic gates indicating the magnetic tampering condition by setting the output of the logic gate high.

9. The power supply of claim 1, wherein the magnetic field detection circuit is further coupled to generate the tampering threshold voltage and a lower threshold voltage proportional to a reference threshold voltage.

10. The power supply of claim 9, wherein the magnetic field detection circuit is further coupled to use the tampering threshold voltage as the reference threshold voltage in response to a detection indicating that the input voltage is high and use the lower threshold voltage as the reference threshold voltage in response to a detection indicating that the input voltage is low.

11. The power supply of claim 10, wherein the magnetic field detection circuit is further coupled to compare the slope voltage with the tampering threshold voltage and the lower threshold voltage.

12. The power supply of claim 3, wherein the magnetic field detection circuit is further coupled to indicate a fault corresponding to a rising slope of the current sense signal.

13. The power supply of claim 3, wherein the magnetic field detection circuit is further coupled to indicate a fault in response to a detection indicating that the tampering threshold voltage is lower than a lower threshold voltage.

14. The power supply of claim 3, wherein the magnetic field detection circuit is further configured to provide a predictive short circuit protection by turning off the energy meter in response to sensing an irregular increase in the primary winding current.

15. The power supply of claim 1, wherein the input voltage comprises one of a higher input voltage corresponding to 220 volts AC and a lower input voltage corresponding to 110 volts AC.

16. The power supply of claim 1, wherein the energy meter is a single phase or a three phase energy meter.

17. The power supply of claim 1, wherein the magnetic field detection circuit is integrated with the power supply and the energy meter.

18. A method of detecting a magnetic tampering detection for a power supply for an energy meter coupled between a power station and a consumer, the method comprising:
sensing a primary winding current at a primary winding of a primary side of a transformer, the primary winding coupled with an input voltage;
sensing a primary winding voltage at the primary winding;
generating a tampering threshold voltage based on a reference threshold voltage;
detecting, by a comparator, that a slope voltage is less than the tampering threshold voltage by comparing, by the comparator, the slope voltage indicating a slope of a current sense signal in response to the primary winding voltage with the tampering threshold voltage;
enabling, by a Set-Reset (SR) latch circuit having an input coupled with an output of the comparator in response to the detecting that the slope voltage is less than the tampering threshold voltage, a magnetic tampering detection signal having a logic value corresponding to a magnetic tampering event.

19. The method of claim 18, wherein the magnetic tampering detection signal is enabled corresponding to a rising slope of the current sense signal.

20. The method of claim 18, wherein the magnetic tampering detection signal is disabled in the absence of a detection indicating that the slope voltage is less than the tampering threshold voltage.

21. The method of claim 18, wherein the magnetic tampering detection signal is unchanged in response to a detection indicating that the slope voltage is between the tampering threshold voltage and a lower threshold voltage.

22. The method of claim 18, further comprising predicting a short circuit event in response to sensing an irregular increase in the primary winding current and further turning off the energy meter.

* * * * *